US008613872B2

United States Patent
Lemmer et al.

(10) Patent No.: US 8,613,872 B2
(45) Date of Patent: Dec. 24, 2013

(54) CHARGE-CARRIER TRANSPORT LAYER FOR AN ELECTRO-OPTICAL COMPONENT, METHOD FOR ITS PRODUCTION AND ELECTRO-OPTICAL COMPONENT

(75) Inventors: Uli Lemmer, Karlsruhe (DE); Julian Hauss, Karlsruhe (DE); Boris Riedel, Karlsruhe (DE); Martina Gerken, Kiel (DE)

(73) Assignee: Karlsruher Institut fuer Technologie, Karlsruhe (DE)

( * ) Notice: Subject to any disclaimer, the term of this patent is extended or adjusted under 35 U.S.C. 154(b) by 323 days.

(21) Appl. No.: 12/860,429

(22) Filed: Aug. 20, 2010

(65) Prior Publication Data
US 2011/0045392 A1  Feb. 24, 2011

(30) Foreign Application Priority Data
Aug. 22, 2009 (EP) ..................................... 09010783

(51) Int. Cl.
H01B 1/00 (2006.01)
H01B 1/02 (2006.01)
H01B 1/12 (2006.01)
H01L 31/00 (2006.01)
H01L 29/08 (2006.01)
H01L 35/24 (2006.01)
H01L 51/00 (2006.01)

(52) U.S. Cl.
USPC .................. 252/519.33; 252/500; 252/519.12; 252/519.3; 252/520.2; 252/520.22; 252/521.3; 136/252; 136/261; 136/263; 257/40

(58) Field of Classification Search
USPC ......... 252/500, 519.12, 519.3, 519.33, 520.2, 252/520.22, 521.3; 136/252, 261, 263; 257/40
See application file for complete search history.

(56) References Cited

U.S. PATENT DOCUMENTS

| 7,256,541 B2 | 8/2007 | Birnstock et al. |
| 7,811,679 B2 | 10/2010 | Aziz et al. |
| 2004/0195962 A1* | 10/2004 | Nakamura et al. ............. 313/504 |
| 2005/0142379 A1* | 6/2005 | Juni et al. ....................... 428/690 |
| 2007/0176174 A1 | 8/2007 | Lee et al. |
| 2008/0135809 A1 | 6/2008 | Hsu |

FOREIGN PATENT DOCUMENTS

| DE | 10164016 A1 | 7/2003 |
| DE | 102007006348 A1 | 6/2008 |
| GB | 2426627 A | 11/2006 |

OTHER PUBLICATIONS

Wang et al., Study of PEDOT: PSS-Sn02 Nanocomposite Film as an Anode for Polymer Electronics, Journal of Electroceramics, Kluwer Academic Publishers, BO, Bd. 18, Nr. 1-2, Feb. 22, 2007, Seiten 161-165, XP019502648 ISSN: 1573-8663.
Bathelt et al., Light Extraction from Oleds for Lighting Applications through Light Scattering, Organic Electronics, 20070516 Elsevier, Amsterdam, NL—ISSN 1566-1199, vol. 8, Nr:4, May 16, 2007, pp. 293-299, XP022080892.
Choy et al, Improving the Viewing Angle Properties of Microcavity OLEDs by Using Dispersive Gratings, Optics Express 20071001 Optical Society of America US, Bd. 15, Nr. 20, Sep. 28, 2007, Seiten 13288-13294, XP7910669.
European Search Report for EP09010783 dated Nov. 27, 2009.

* cited by examiner

Primary Examiner — Mark Kopec
Assistant Examiner — Tanisha Diggs
(74) Attorney, Agent, or Firm — Leydig, Voit & Mayer, Ltd.

(57) ABSTRACT

A charge-carrier transport layer for an electro-optical component includes an organic charge-carrier transport material. A plurality of first particles having a diameter ranging from 1 nm to 100 nm is incorporated in the organic charge-carrier transport material and contains a first transparent oxide. A plurality of second particles having a diameter between 100 nm and 1000 nm is also incorporated into the organic charge-carrier transport material and contains a second transparent oxide. The index of refraction of the plurality of second particles differs from the index of refraction of the organic charge-transport material.

14 Claims, 2 Drawing Sheets

CHARGE-CARRIER TRANSPORT LAYER FOR AN ELECTRO-OPTICAL COMPONENT, METHOD FOR ITS PRODUCTION AND ELECTRO-OPTICAL COMPONENT

CROSS-REFERENCE TO RELATED APPLICATIONS

This patent application claims priority to European Patent Application No. 09010783.0, which was filed on Aug. 22, 2009, and which is incorporated herein in its entirety by reference.

FIELD

The invention relates to a charge-carrier transport layer for an electro-optical component, to a method for its production and to an electro-optical component, preferably an organic light-emitting diode (OLED) or an organic solar cell, into which the charge-carrier transport layer according to the invention has been incorporated.

BACKGROUND

Transparent charge-carrier transport layers, that is to say, transport layers for electrons or holes, play a crucial role in many applications in large-surface opto-electronics, especially in displays, touchpads or solar cells. To an increasing degree, charge-carrier transport layers contain organic materials, particularly in the case of organic light-emitting diodes (OLEDs) and organic solar cells. The advantage of organic materials, especially of polymers, is that they can be processed out of the liquid phase and therefore allow the vacuum-free—and thus cost-effective—production of large-surface electro-optical elements.

As a rule, radiation-emitting components, especially organic light-emitting diodes (OLEDs), have a hole transport layer and often also an electron transport layer. In spite of an internal quantum efficiency of up to 100% for the conversion of electron-hole pairs into photons, if no additional measures are taken, the total reflection inside the radiation-emitting component allows only about 20% of the light to reach the outside, where it can then be further utilized.

British application GB 2 426 627 A describes a light-emitting component that contains a light-absorbing layer in which metallic nanocrystalline particles having a mean size of 2 nm to 20 nm have been incorporated into a matrix.

German patent application DE 101 64 016 A1 describes an organic light-emitting diode (OLED) with an organic charge-carrier transport layer that comprises at least two partial areas that differ in terms of their index of refraction. In this context, the at least two partial areas are made up of different polymers which form a composite-like structure owing to different degrees of cross-linking or of molecular branching, and to different densities or copolymerization of the various polymers.

German patent application DE 10 2007 006 348 A1 describes a light-emitting component that contains a substrate or a layer which—relative to the emitter layer—is adjacent to the substrate on the outside, and into which scatter particles having a size ranging from 1 nm to 10 µm have been incorporated. Nanoparticles made of gold, silver, platinum, nickel, copper or polystyrene are employed as the scattered particles, whereby the scatter particles preferably have a nucleus area and a shell.

U.S. patent application 2007/0176174 A1 describes a conductive polymer for electro-optical devices which comprises $SiO_2$ or $TiO_2$ nanoparticles having diameters ranging from 5 nm to 100 nm. Preferably, a PEDOT:PSS derivative is used as the conductive polymer.

U.S. patent application 2008/135809 A1 describes conductive polymers for OLEDs, whereby the conductive polymers comprise PANI or PEDOT, wherein nanoparticles, especially $SiO_2$ or Nafion nanoparticles having a size of less than 1000 nm, have been incorporated.

SUMMARY

In an embodiment, the present disclosure provides a charge-carrier transport layer for an electro-optical component. The charge-carrier transport component includes an organic charge-carrier transport material. A plurality of first particles having a diameter ranging from 1 nm to 100 nm is incorporated in the organic charge-carrier transport material and includes a first transparent oxide. A plurality of second particles having a diameter between 100 nm and 1000 nm is incorporated into the organic charge-carrier transport material and includes a second transparent oxide. An index of refraction of the plurality of second particles differs from an index of refraction of the organic charge-transport material.

BRIEF DESCRIPTION OF THE DRAWINGS

The invention will be explained in greater detail below on the basis of embodiments, making reference to the figures.

DETAILED DESCRIPTION

Figure 1:
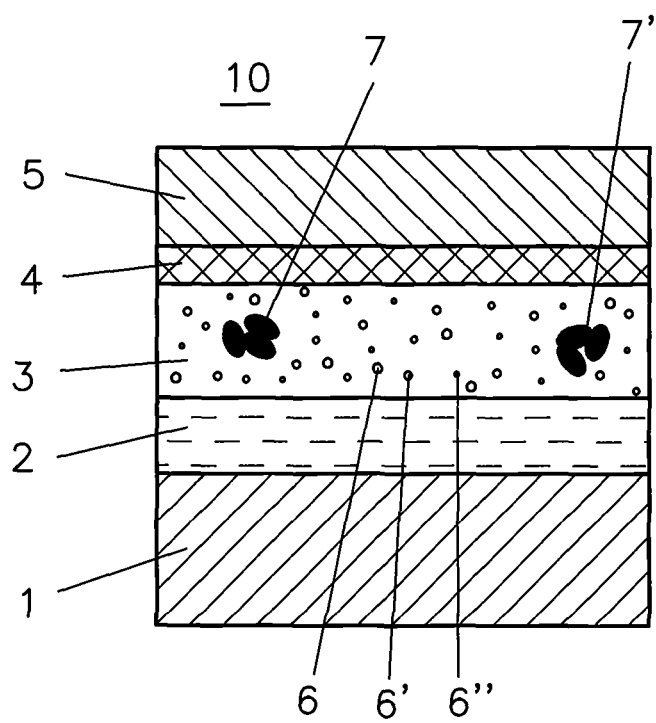
FIG. 1 is a schematic depiction of the structure of an OLED having a charge-carrier transport layer according to the invention as a hole transport layer in accordance with the disclosure.

In one aspect, the present disclosure describes a charge-carrier transport layer for an electro-optical component, a method for its production and an electro-optical component into which a charge-carrier transport layer has been incorporated, all of which do not entail the above-mentioned drawbacks and limitations.

In particular, a charge-carrier transport layer is provided in which the layer thickness and the effective index of refraction can be adjusted with respect to the scattering behavior of the photons, whereby such a layer should hardly lose any of its transparency and electric conductivity in spite of the greater scattering effect.

Moreover, a production method is disclosed that is specially adapted for this purpose and that is easy to execute.

Finally, an electro-optical component is disclosed into which a charge-carrier transport layer according to the invention has been incorporated.

More specifically, a charge-carrier transport layer according to the invention comprises an organic charge-carrier transport material, preferably the cationic form of the polymer poly(3,4-ethylene dioxythiophene) with polystyrene sulfonic acid, usually abbreviated as PEDOT:PSS, or else polyaniline. A plurality of first particles (nanoparticles) having a diameter ranging from 1 nm to 100 nm are incorporated into the present organic charge-carrier transport material. Moreover, a plurality of second particles having a diameter between 100 nm and 1000 nm, or else agglomerates made up of them, are incorporated into the organic charge-carrier transport material. Due to their size, the index of refraction of the second particles differs from the index of refraction of the organic material.

The charge-carrier transport layer preferably has a thickness ranging from 100 nm to 1000 nm. However, the layer thickness of the charge-carrier transport layer is selected such that is not less than the actual diameters of the second particles or of the agglomerates made up of them.

The charge-carrier transport layer contains first particles that consist partially or entirely of a transparent oxide, especially silicon dioxide. In one embodiment, the charge-carrier transport layer contains second particles that consist partially or entirely of a transparent oxide, especially titanium dioxide. Although the second particles preferably make up agglomerates, they can also occur individually in the charge-carrier transport layer.

The second particles themselves can be either solid or hollow. Hollow particles can be produced by coating a plurality of particles made of a polymer such as polystyrene with oxide and by subsequently removing the polymer by means of thermal combustion.

A charge-carrier transport layer according to the invention can preferably be produced using the method disclosed herein. For this purpose, the selected first particles, and optionally the second particles, are dispersed in a shared solvent together with the organic material that has been provided for the charge-carrier transport layer, preferably PEDOT:PSS or polyaniline, and then applied onto a substrate, preferably by means of a coating method, by means of spin coating or by doctor blades. The selection of the composition and concentration of the particles as well as of the thickness of the charge-carrier transport layer makes it possible to set the effective index of refraction of a waveguide mode in an electro-optical component into which a charge-carrier transport layer has been incorporated.

Especially by determining the thickness of the charge-carrier transport layer, which increases as a result of admixing the particles, it is not only possible to set an optimal mode distribution in the electro-optical component but also to concurrently increase the light-emitting efficiency of organic light-emitting diodes (OLEDs) or the light-receiving efficiency of organic solar cells. Whereas the first particles influence the value of the effective index of refraction in the charge-carrier transport layer, the second particles or the agglomerates made up of them function like optical scattering centers which effectively scatter the fraction of the light that is carried as the waveguide mode through a charge-carrier transport layer according to the invention out of the component (OLEDs) or which couple in said light fraction (solar cells). If the thickness of the charge-carrier transport layer remains constant and if the concentration of first particles and second particles is the same, then, in addition, the effective index of refraction of the hole transport layer is influenced by the wall thicknesses of hollow particles.

The disclosure relates to an electro-optical component into which the charge-carrier transport layer according to the invention is incorporated, particularly an organic light-emitting diode (OLED) or an organic solar cell. Thus, a suitably configured charge-carrier transport layer according to the invention can be used in an OLED as a hole transport layer, as an electron transport layer, as an anode and/or as a cathode. Particularly when the charge-carrier transport layer according to the invention is employed as an anode, it is preferably mixed with dimethyl sulfoxide (DMSO) in order to increase the lateral conductivity, and it replaces an anode made of indium tin oxide (ITO).

In one embodiment, the charge-carrier transport layer according to the disclosure (hole or electron transport layer) is used to smooth rough anodes or cathodes or else to equalize an existing height difference on the surface of a layer, particularly in order to avoid any short-circuits.

Electro-optical components having one or more charge-carrier transport layers according to the invention can be employed in a plurality of applications such as displays, touchpads or touchscreens. One advantageous aspect of the disclosed charge-carrier transport layer is that it can have a scattering layer that is 2 to 10 times thicker than conventional charge-carrier transport layer, and yet it hardly loses any of its transparency and electric conductivity. FIG. 1 schematically shows the structure of an organic light-emitting diode (OLED) 10 that has a hole transport layer 3 according to the invention. A transparent anode 2 consisting of indium tin oxide (ITO) is arranged on a substrate 1 that is transparent for large segments of the optical spectrum, that is to say, from the ultraviolet range to the visible range all the way to the infrared range, and that is preferably made of a transparent material such as glass, plastic and the like.

On the opposite side of the OLED 10, there is a cathode 5 made of a conductive material which has a low work function for the electrons. Suitable materials for use in the cathode 5 include calcium, magnesium, and other materials. The cathode 5 in the illustrated embodiment is in direct contact with an organic emitter layer 4. The organic emitter layer 4 is a layer configured for emitting an optical radiation. One example of a suitable material for the organic emitter layer 4 is a phenylene-substituted poly(p-phenylene vinylene) (PVV). In an alternative embodiment, an electron transport layer (not shown) may be interposed between the cathode 5 and the organic emitter layer 4.

A hole transport layer 3, which lowers the injection barrier for the holes from the anode 2, is inserted between the anode 2 and the emitter layer 4. The hole transport layer 3 may also prevent certain elements of the anode, such as indium, from diffusing out of the anode 2 into the emitter layer 4. The hole transport layer 3 is made of organic material, such as PEDOT:PSS, into which a plurality of first particles 6, 6', 6", ... as well as a plurality of agglomerates 7, 7' made up of second particles are incorporated. The index of refraction of the second particles is selected to be different than the index of refraction of the organic material.

Three exemplary materials are provided below. Each of the exemplary materials was used in the samples of particle mixtures for the hole transport layer 3 but, of course, should not be construed as in any way limiting its scope.

EXAMPLE 1

Sample designated as LH2O13-3000 in the figures and description that follows includes a mixture or dispersion consisting of 23.5% by volume of $SiO_2$ particles (ready-made dispersion, particle size ranging from 20 nm to 30 nm), 47.65% by volume of $H_2O$, and 50% by volume of PEDOT:PSS, which was applied onto the transparent anode 2 by means of spin-coating at 3000 rpm.

EXAMPLE 2

Sample designated as TL11-1000 in the figures and description that follows includes a mixture or dispersion consisting of 0.925% by volume of $TiO_2$ (aqueous dispersion, particle size ranging from 20 nm to 130 nm), 4.705% by volume of $SiO_2$ (ready-made dispersion, particle size ranging from 20 nm to 30 nm), 44.37% by volume of $H_2O$, and 50% by volume of PEDOT:PSS, which was applied by means of spin-coating at 1000 rpm.

EXAMPLE 3

Sample designated as TL21-1000 in the figures and the description that follows includes a mixture or dispersion consisting of 1.23% by volume of $TiO_2$ (aqueous dispersion, particle size ranging from 20 nm to 130 nm), 3.14% by volume of $SiO_2$ (ready-made dispersion, particle size ranging from 20 nm to 30 nm), 45.63% by volume of $H_2O$, and 50% by volume of PEDOT:PSS, which was applied by means of spin-coating at 1000 rpm.

Figure 2:
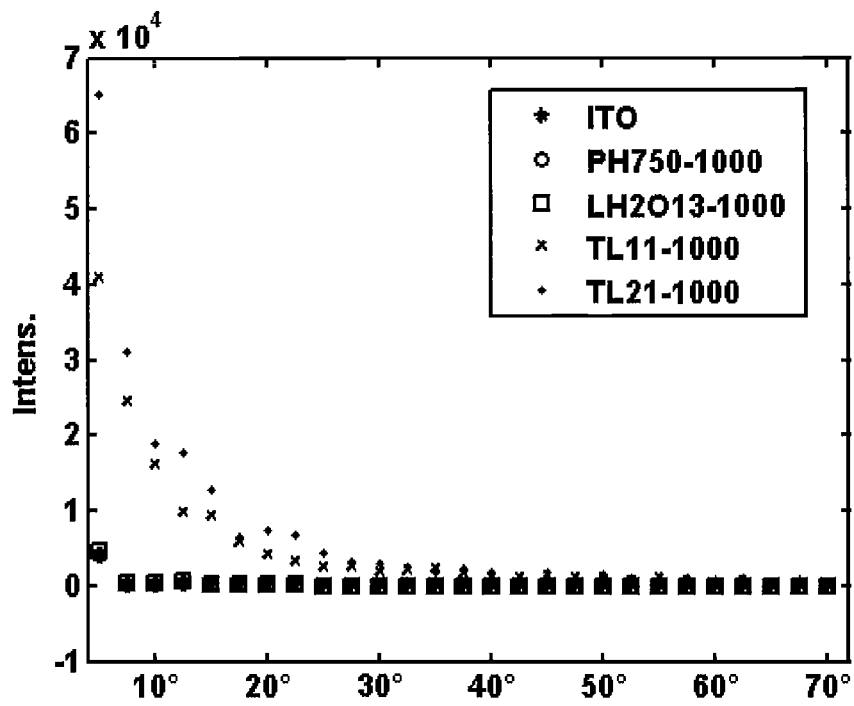
FIG. 2 is a graph illustrating the angle-resolved scattering behavior in the case of irradiation at a wavelength $\lambda=532$ nm of a charge-carrier transport layer in accordance with the disclosure.

FIG. 2 is a chart illustrating the angle-resolved scattering behavior of various samples of hole transport layers 3, each of which was located on a transparent anode 2 applied onto a substrate 1 and contained the particle mixtures specified in each case. For this purpose, the layers in question were transilluminated by a laser that emitted light at a wavelength $\lambda=532$ nm and the scattering point was recorded in an angle-resolved manner.

In reference to FIG. 2, the sample designated as PH750-1000 served as a baseline experiment because it contained neither first particles nor second particles, but was rather made up entirely of PEDOT:PSS. As an additional baseline experiment, a sample designated as ITO was employed that did not contain a hole transport layer 3. The sample designated as ITO instead only contained a transparent anode 2 made of indium tin oxide (ITO) had been applied onto a substrate 1. Comparison of the remaining samples tested with these two baseline samples illustrates the marked increase of the scatter at small angles in samples that contained a hole transport layer according to the invention. As shown in the graph, the increase of intensity of certain samples was more than eight fold especially for small angles.

Figure 3:
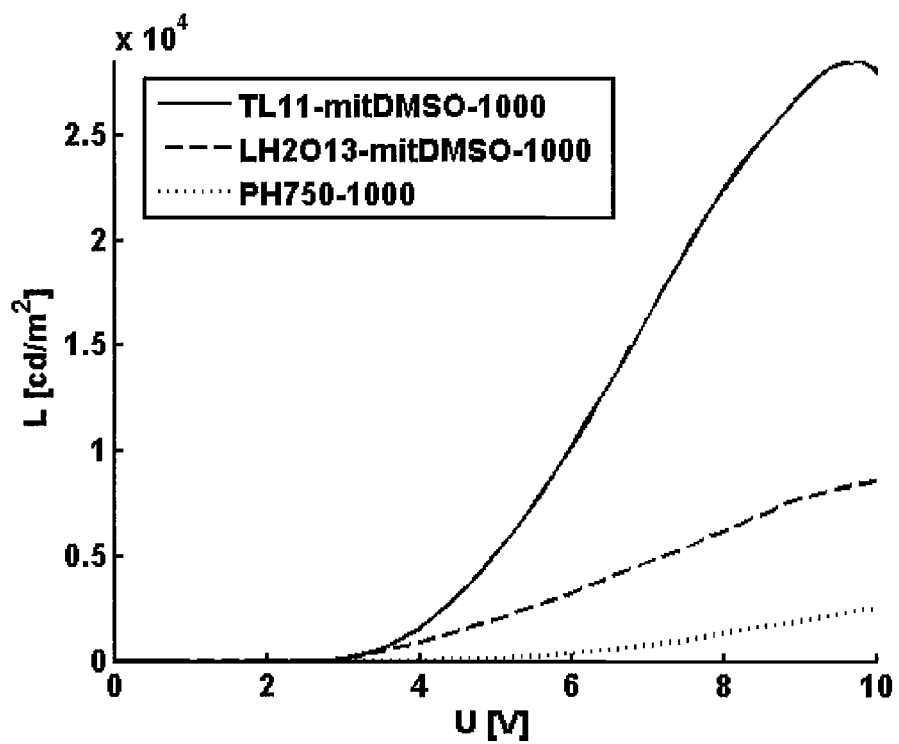
FIG. 3 is a chart illustrating luminance in $cd/m^2$ plotted against an external voltage (in volts) that has been applied to an OLED in accordance with the disclosure.

FIG. 3 illustrates the luminance (in $cd/m^2$) plotted against the external voltages (in volts) that were applied to organic light-emitting diodes (OLEDs) 10. Each OLED 10 had a hole transport layer 3 included therewith in accordance with the disclosure. In these experiments, a mixture consisting of 95% by volume of PEDOT:PSS and 5% by volume of dimethyl sulfoxide (DMSO) was admixed to both samples, namely, TL11 with DMSO-1000 and LH2O13 with DMSO-100, instead of pure PEDOT:PSS.

DMSO is normally admixed with PEDOT:PSS in order to increase the lateral conductivity. In the present case, the admixture of DMSO served to increase the vertical conductivity as well, so that a lower voltage drops over the hole transport layers 3 containing particles according to the invention.

The sample designated as PH750-1000 served as the baseline experiment and thus contained neither first particles nor second particles, but rather exclusively PEDOT:PSS. As can be seen in FIG. 3, the luminance of an OLED containing a hole transport layer according to the invention was considerably higher than that of the experimental sample.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A charge-carrier transport layer for an electro-optical component, comprising:
   an organic charge-carrier transport material;
   a plurality of first particles having a diameter ranging from 1 nm to 100 nm incorporated in the organic charge-carrier transport material, the plurality of first particles including a first transparent oxide; and
   a plurality of second particles having a diameter that is larger than the diameter of the first particles and is between 100 nm and 1000 nm, the plurality of second particles being incorporated into the organic charge-carrier transport material and including a second transparent oxide;
   wherein an index of refraction of the plurality of second particles differs from an index of refraction of the organic charge-transport material,
   wherein the charge-carrier transport layer has a layer thickness ranging from 100 nm to 1000 nm,
   wherein the first transparent oxide contains silicon dioxide and the second transparent oxide contains titanium dioxide, and
   wherein the organic charge-carrier transport material contains at least one of PEDOT:PSS and polyaniline.

2. The charge-carrier transport layer of claim 1, wherein at least some of the plurality of second particles are present as agglomerates.

3. The charge-carrier transport layer according to claim 2, wherein the layer thickness is not less than diameters of the agglomerates.

4. The charge-carrier transport layer according to claim 1 wherein the layer thickness is not less than diameters of the plurality of second particles.

5. A method for the production of a charge-carrier transport layer for an electro-optical component according to claim 1, comprising:

dispersing the plurality of first particles having a diameter ranging from 1 nm to 100 nm in a shared solvent together with the organic charge-carrier transport material;

applying the dispersion of the plurality of first particles and of the organic material onto a substrate; and providing the plurality of second particles having a diameter between 100 nm and 1000 nm incorporated into the organic charge-carrier transport material.

6. The method according to claim 5, further comprising:

dispersing the plurality of first particles and the plurality of second particles in the shared solvent together with the organic charge-carrier transport material to yield a combined dispersion; and applying the combined dispersion onto the substrate.

7. The method according to claim 5, wherein at least some of the plurality of second particles are presented as agglomerates.

8. The method according to claim 7, wherein the layer thickness is not less than diameters of the agglomerates.

9. The method according to claim 5, wherein the layer thickness is not less than diameters of the plurality of second particles.

10. An electro-optical component having a charge-carrier transport layer, the charge-carrier transport layer comprising:

an organic charge-carrier transport material;

a plurality of first particles having a diameter ranging from 1 nm to 100 nm incorporated in the organic charge-carrier transport material, the plurality of first particles including a first transparent oxide; and a plurality of second particles having a diameter that is larger than the diameter of the first particles and is between 100 nm and 1000 nm, the plurality of second particles being incorporated into the organic charge-carrier transport material and including a second transparent oxide;

wherein an index of refraction of the plurality of second particles differs from an index of refraction of the organic charge-transport material, wherein the charge-carrier transport layer has a layer thickness ranging from 100 nm to 1000 nm, wherein the first transparent oxide contains silicon dioxide and the second transparent oxide contains titanium dioxide, and wherein the organic charge-carrier transport material contains at least one of PEDOT:PSS and polyaniline.

11. The electro-optical component according to claim 10, wherein at least some of the plurality of second particles are presented as agglomerates.

12. The electro-optical component according to claim 11, wherein the charge-carrier transport layer has a layer thickness ranging from 100 nm to 1000 nm, and wherein the layer thickness is not less than diameters of the agglomerates.

13. The electro-optical component according to claim 10, wherein the charge-carrier transport layer has a layer thickness ranging from 100 nm to 1000 nm, and wherein the layer thickness is not less than diameters of the plurality of second particles.

14. The electro-optical component according to claim 13, wherein the electro-optical component is configured as at least one of an organic light-emitting diode (OLED) and an organic solar cell.

* * * * *